(12) United States Patent
Nagai

(10) Patent No.: US 7,435,607 B2
(45) Date of Patent: *Oct. 14, 2008

(54) METHOD OF WAFER LASER PROCESSING USING A GAS PERMEABLE PROTECTIVE TAPE

(75) Inventor: Yusuke Nagai, Tokyo (JP)

(73) Assignee: Disco Corporation, Tokyo (JP)

( * ) Notice: Subject to any disclaimer, the term of this patent is extended or adjusted under 35 U.S.C. 154(b) by 208 days.

This patent is subject to a terminal disclaimer.

(21) Appl. No.: 11/028,737

(22) Filed: Jan. 5, 2005

(65) Prior Publication Data
US 2005/0158968 A1 Jul. 21, 2005

(30) Foreign Application Priority Data
Jan. 15, 2004 (JP) ............................. 2004-007850

(51) Int. Cl.
*H01L 21/00* (2006.01)
(52) U.S. Cl. .................... 438/33; 438/462; 438/463; 438/464; 451/41; 451/55
(58) Field of Classification Search ................ None
See application file for complete search history.

(56) References Cited
U.S. PATENT DOCUMENTS 5,814,532 A * 9/1998 Ichihara ................. 438/33
6,177,912 B1 * 1/2001 Izumi ..................... 345/1.3
6,583,383 B2 * 6/2003 Higashi et al. ......... 219/121.72
7,060,532 B2 * 6/2006 Takyu et al. ............... 438/114
7,090,325 B2 * 8/2006 Hashimoto et al. ........... 347/20
7,134,943 B2 * 11/2006 Nagai et al. ................. 451/41
7,232,741 B2 * 6/2007 Nagai et al. ................. 438/460

FOREIGN PATENT DOCUMENTS

JP 2002-192367 7/2002

* cited by examiner

*Primary Examiner*—Zandra Smith
*Assistant Examiner*—Khanh B Duong
(74) *Attorney, Agent, or Firm*—Smith, Gambrell & Russell, LLP

(57) ABSTRACT

A laser processing method for forming a deteriorated layer, which has been once molten and then re-solidified, in the inside of a wafer by applying a pulse laser beam capable of passing through the wafer to the wafer along a dividing line formed on the wafer, comprising: a protective tape affixing step for affixing a protective tape having gas permeability to one side of the wafer; a wafer holding step for holding the wafer having the protective tape affixed thereto on the chuck table of a laser beam machine in such a manner that the surface side onto which the protective tape has been affixed comes into contact with the chuck table; and a laser beam application step for applying a pulse laser beam capable of passing through the wafer from the other surface side of the wafer held on the chuck table with its focusing point set to a position near the one surface of the wafer to form the deteriorated layer exposed to the one surface along the dividing line in the inside of the wafer.

3 Claims, 4 Drawing Sheets

METHOD OF WAFER LASER PROCESSING USING A GAS PERMEABLE PROTECTIVE TAPE

FIELD OF THE INVENTION

The present invention relates to a wafer laser processing method for forming a deteriorated layer in the inside of a wafer by applying a pulse laser beam capable of passing through the wafer along a dividing line formed on the wafer.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a circuit such as IC or LSI is formed in each of the sectioned areas. Individual semiconductor chips are manufactured by cutting this semiconductor wafer along the streets to divide it into the areas in which the circuit is formed. An optical device wafer comprising optical devices comprising laminated gallium nitride-based compound semiconductors formed in a plurality of areas sectioned by dividing lines on the front surface of a sapphire substrate or a wafer comprising piezoelectric devices arranged in a plurality of areas sectioned by dividing lines on the front surface of a lithium tantalate substrate is divided into individual devices such as light emitting diodes or laser diodes which are widely used in electric equipment.

Cutting along the dividing lines of the above semiconductor wafer or optical device wafer is generally carried out by a cutting machine called "dicer". This cutting machine comprises a chuck table for holding a wafer as a workpiece, a cutting means for cutting the wafer held on the chuck table, and a moving means for moving the chuck table and the cutting means relative to each other. The cutting means comprises a rotary spindle that is rotated at a high speed and a cutting blade mounted onto the spindle. The cutting blade comprises a disk-like base and an annular cutting edge, which is mounted to the side wall outer periphery of the base and formed as thick as about 20 μm by fixing diamond abrasive grains having a diameter of about 3 μm to the base by electroforming. Since the sapphire substrate and the lithium tantalite substrate have high Mohs hardness, cutting with the above cutting blade is not always easy.

As a means of dividing a plate-like workpiece such as a semiconductor wafer, a laser processing method for applying a pulse laser beam capable of passing through the workpiece with its focusing point set to the inside of the area to be divided is attempted and disclosed by JP-A 2002-192367, for example. In the dividing method using this laser processing technique, the workpiece is divided by applying a pulse laser beam having an infrared range capable of passing through the workpiece from one side of the workpiece with its focusing point set to the inside to continuously form deteriorated layers in the inside of the workpiece along the dividing lines and applying external force along the dividing lines whose strength has been reduced by the formation of the deteriorated layers.

To carry out the laser processing of a wafer comprising a sapphire substrate or lithium tantalite substrate, a protective tape is affixed to the front surface or back surface of the wafer, and a pulse laser beam capable of passing through the wafer is applied to the wafer in a state where its surface side on which the protective tape is affixed is held on the chuck table so as to form a deteriorated layer, which has been once molten and then re-solidified, in the inside of the wafer. Therefore, in order to form the deteriorated layer in the inside of the wafer without cracking the wafer, the deteriorated layer must be exposed to the surface having a protective tape affixed thereon by applying a laser beam having such a degree of power density that does not crack the wafer to the inside of the wafer and setting the focusing point of the laser beam to a position near the surface having a protective tape affixed thereon. When the laser beam is thus applied with its focusing point set to a position near the surface having a protective tape affixed thereon, as the protective tape absorbs the energy of the laser beam, the component constituting the protective tape changes and the component constituting the wafer also changes by heating to produce bubbles which accumulate in a space between the protective tape and the wafer. As a result, a problem arises in that the wafer held on the chuck table is slightly raised by the bubbles, whereby the focusing point of the laser beam is displaced and a uniform deteriorated layer cannot be formed thereby. Further, there is another problem in that since the wafer held on the chuck table is slightly raised by the bubbles, the wafer holding force of the chuck table weakens.

SUMMARY OF THE INVENTION

It is an object of the present invention to provide a wafer laser processing method capable of removing the influence of bubbles even when a protective tape affixed to a wafer absorbs the energy of a laser beam applied to the wafer to produce the bubbles.

To attain the above object, according to the present invention, there is provided a wafer laser processing method for forming a deteriorated layer, which has been once molten and then re-solidified, in the inside of a wafer by applying a pulse laser beam capable of passing through the wafer to the wafer along a dividing line formed on the wafer, comprising:

a protective tape affixing step for affixing a protective tape having gas permeability to one side of the wafer;

a wafer holding step for holding the wafer having the protective tape affixed thereto on the chuck table of a laser beam machine in such a manner that the surface side onto which the protective tape has been affixed comes into contact with the chuck table; and a laser beam application step for applying a pulse laser beam capable of passing through the wafer from the other surface side of the wafer held on the chuck table with its focusing point set to a position near the one surface of the wafer to form the deteriorated layer exposed to the one surface along the dividing line in the inside of the wafer.

The above protective tape having gas permeability is a mesh-like tape or porous tape.

In the present invention, since the protective tape affixed to one side of the wafer has gas permeability, bubbles produced when the protective tape is heated by the energy of the laser beam do not accumulate in a space between the protective tape and the wafer and are discharged through the protective tape. Therefore, the bubbles do not accumulate in the space between the protective tape and the wafer and do not raise the wafer. Consequently, the displacement of the focusing point of the laser beam caused by the rise of the wafer held on the chuck table by the bubbles can be prevented and a decline in the wafer holding force of the chuck table is eliminated.

DETAILED DESCRIPTION OF THE PREFERRED EMBODIMENTS

Preferred embodiments of the wafer laser processing method of the present invention will be described hereinunder with reference to the accompanying drawings.

Figure 1:
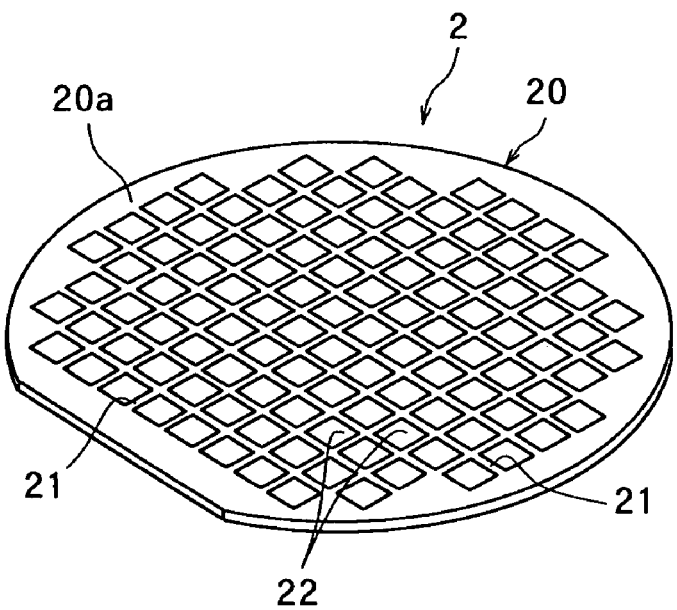
FIG. 1 is a perspective view of an optical device wafer to be laser processed by the wafer laser processing method of the present invention.

FIG. 1 is a perspective view of an optical device wafer as a wafer to be processed by the laser processing method of the present invention. In the optical device wafer 2 shown in FIG. 1, optical devices 22 comprising laminated gallium nitride-based compound semiconductors are formed in a plurality of areas sectioned by dividing lines 21 on the front surface 20a of a sapphire substrate 20. A description is subsequently given of a wafer laser processing method for carrying out laser processing along the dividing lines 21 of this optical device wafer 2.

Figure 2:
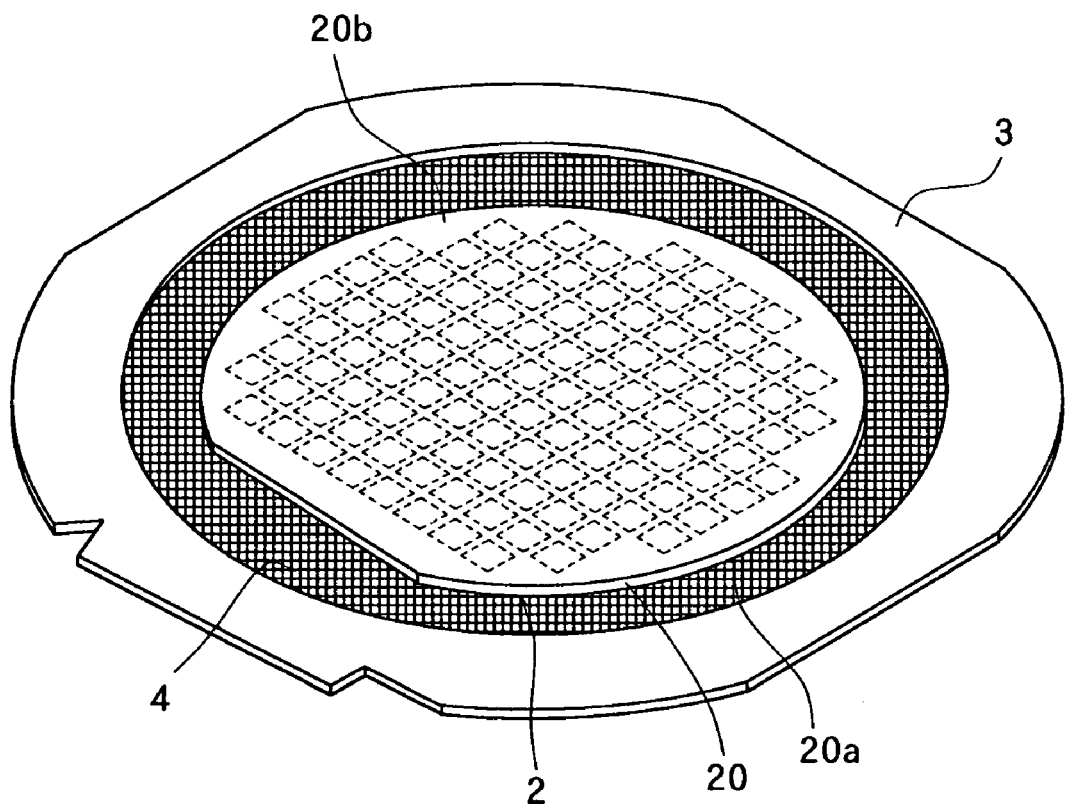
FIG. 2 is a perspective view of the optical device wafer shown in FIG. 1 put to a protective tape having gas permeability mounted on an annular frame.
Figure 3:
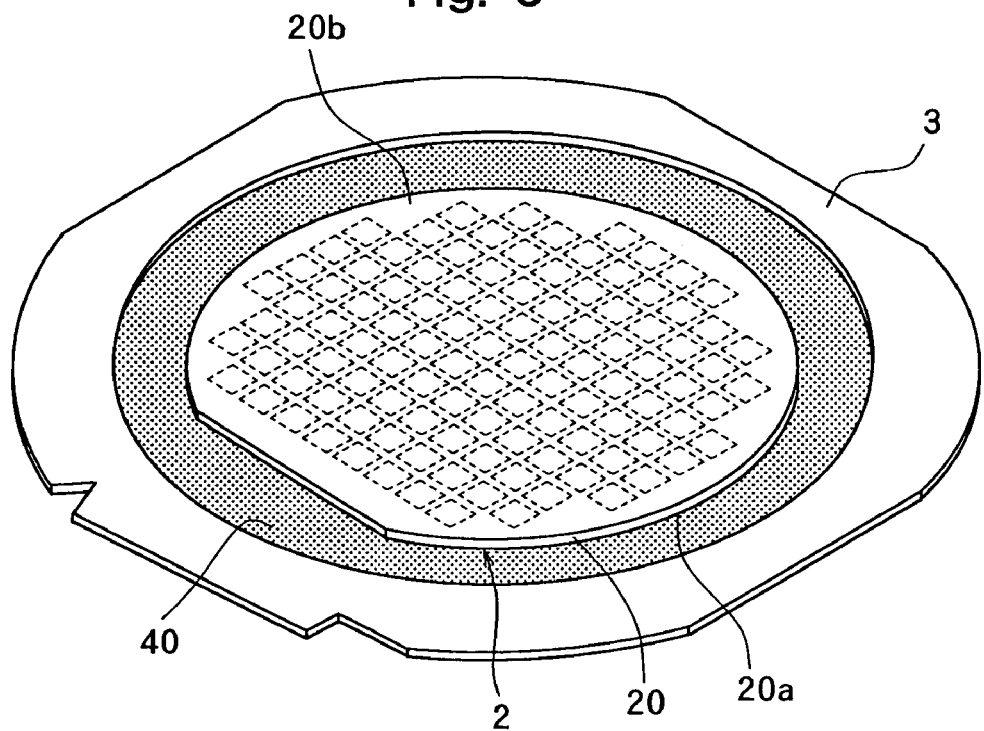
FIG. 3 is a perspective view of the optical device wafer shown in FIG. 1 put to another protective tape having gas permeability mounted on the annular frame.

To carry out laser processing along the dividing lines 21 of the above-described optical device wafer 2, the step of affixing a protective tape having gas permeability to one surface of the above optical device wafer 2 is first carried out. This protective tape affixing step is toputone surface (the front surface 20a of the sapphire substrate 20 forming the optical device wafer 2 in the illustrated embodiment) of the optical device wafer 2 to a protective tape 4 having gas permeability mounted on an annular frame 3 as shown in FIG. 2. Therefore, the back surface 20b of the optical device wafer 2 put to the protective tape 4 faces up. As the above protective tape 4 having gas permeability is used a mesh-like adhesive tape manufactured by applying an adhesive to the surface of a tape formed, like a fabric, out of resin fibers. FIG. 3 shows another example of the protective tape having gas permeability, mounted on the annular frame 3. The protective tape 40 having gas permeability shown in FIG. 3 is a porous adhesive tape manufactured by applying an adhesive to the surface of a porous resin tape.

The step of holding the optical device wafer 2 having the protective tape 4 (40) affixed thereto on the chuck table of a laser beam machine in such a manner that the surface side onto which a protective tape has been affixed comes into contact with the chuck table comes after the above protective tape affixing step. The laser beam machine will be described with reference to FIGS. 4 to 6. The laser beam machine shown in FIGS. 4 to 6 comprises a chuck table 51 for holding a workpiece, a laser beam application means 52 for applying a laser beam to the workpiece held on the chuck table 51 and an image pick-up means 53 for picking up an image of the workpiece held on the chuck table 51. The holding portion for holding the workpiece of the chuck table 51 is made of a porous ceramic and connected to a suction means (not shown), and is so constituted as to suitably suction-hold the workpiece placed on the top surface thereof, and the above annular frame 3 is so constituted as to be clamped by a clamp mechanism that is not shown. The chuck table 51 is moved in a processing-feed direction indicated by an arrow X and an indexing-feed direction indicated by an arrow Y in FIG. 4 by a moving mechanism that is not shown.

Figure 5:
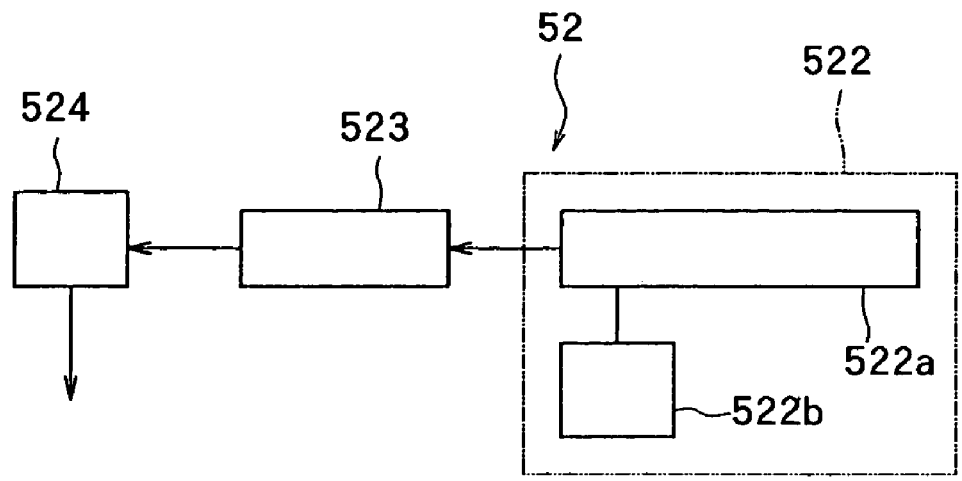
FIG. 5 is a block diagram schematically showing the constitution of the laser beam application means of the laser beam machine shown in FIG. 4.
Figure 6:
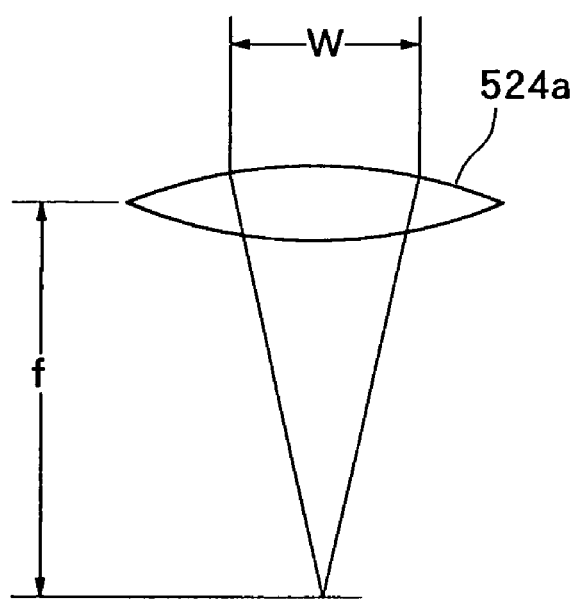
FIG. 6 is a schematic diagram for explaining the focusing spot diameter of a pulse laser beam.

The above laser beam application means 52 has a cylindrical casing 521 arranged substantially horizontally. In the casing 521, there are installed a pulse laser beam oscillation means 522 and a transmission optical system 523, as shown in FIG. 5. The pulse laser beam oscillation means 522 comprises a pulse laser beam oscillator 522a composed of a YAG laser oscillator or YVO4 laser oscillator and a repetition frequency setting means 522b connected to the pulse laser beam oscillator 522a. The transmission optical system 523 comprises suitable optical elements such as a beam splitter etc. A condenser 524 housing condensing lenses (not shown) constituted by a set of lenses that may be a known formation is attached to the end of the above casing 521. A laser beam oscillated from the above pulse laser beam oscillation means 522 reaches the condenser 524 through the transmission optical system 523 and is applied from the condenser 524 to the workpiece held on the above chuck table 51 at a predetermined focusing spot diameter D. This focusing spot diameter D is defined by the expression D (μm)=4×λ×f/ (π×W) (wherein λ is the wavelength (μm) of the pulse laser beam, W is the diameter (mm) of the pulse laser beam applied to an objective condenser lens 524a, and f is the focusing distance (mm) of the objective condenser lens 524a) when the pulse laser beam having a Gauss distribution is applied through the objective condenser lens 524a of the condenser 524 as shown in FIG. 6.

The image pick-up means 53 mounted to the end of the casing 521 constituting the above laser beam application means 52 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is transmitted to a control means that is not shown.

Figure 4:
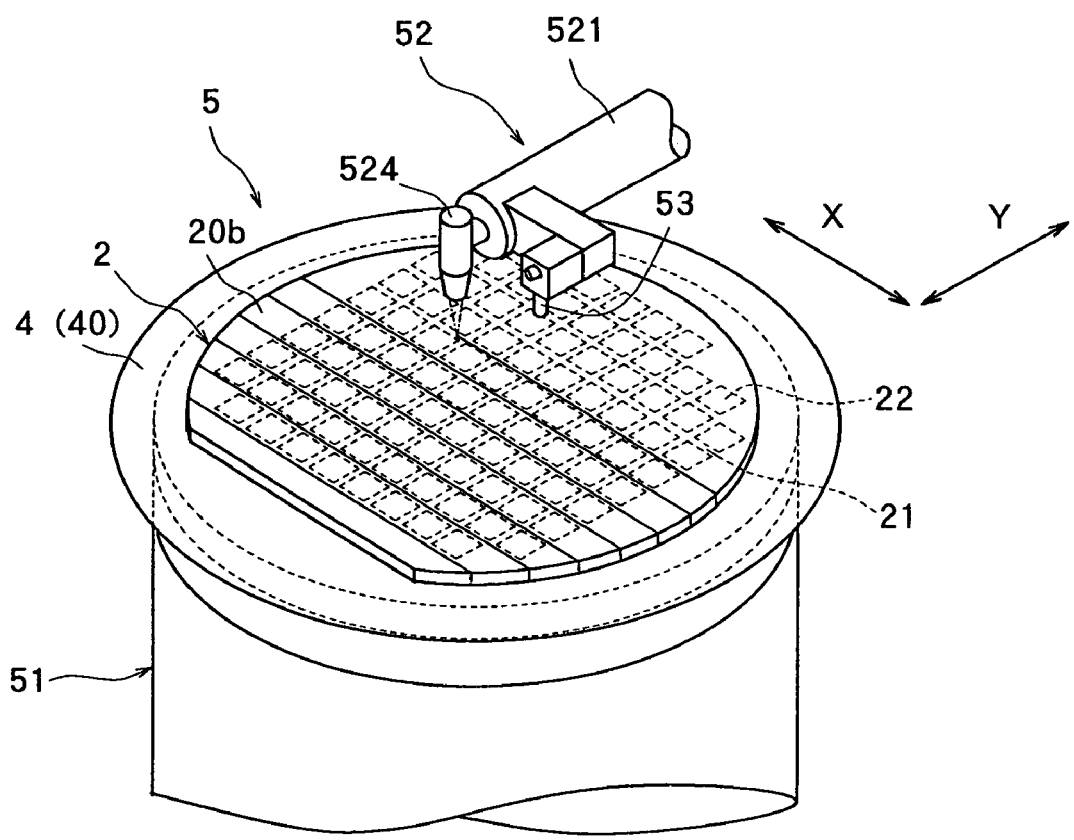
FIG. 4 is a perspective view of the principal section of a laser beam machine for carrying out the laser beam application step in the wafer laser processing method of the present invention.

In the above wafer holding step, the optical device wafer 2 having the protective tape 4 (40) affixed thereto is placed on the chuck table 51 of the laser beam machine 5 shown in FIG. 4 in such a manner that the surface side onto which the protective tape 4 has been affixed comes into contact with the chuck table 51. And, by operating the suction means (not shown), the optical device wafer 2 having the protective tape 4 (40) affixed thereto is suction-held on the chuck table 51. Therefore, the other side (the back surface 20b of the sapphire substrate 20 forming the optical device wafer 2 in the illustrated embodiment) of the optical device wafer 2 held on the chuck table 51 faces up.

After the wafer holding step is carried out as described above, there comes the step of applying a pulse laser beam capable of passing through the wafer from the other surface side of the optical device wafer 2 held on the chuck table 51 of the laser beam machine 5 with its focusing point set to a position near the one surface of the wafer to form a deteriorated layer exposed to the one surface along a dividing line, in the inside of the wafer. This laser beam application step will be described with reference to FIG. 4, FIGS. 7(a) and 7(b), and FIG. 8.

The chuck table 51 suction-holding the optical device wafer 2 in the wafer holding step as described above is positioned right below the image pick-up means 53 by the moving mechanism that is not shown. After the chuck table 51 is positioned right below the image pick-up means 53, alignment work for detecting the area to be processed of the optical device wafer 2 is carried out by the image pick-up means 53 and the control means that is not shown. That is, the image pick-up means 53 and the control means (not shown) carry out image processing such as pattern matching and so on to align a dividing line 21 formed in a predetermined direction of the optical device wafer 2 with the condenser 524 of the laser beam application means 52 for applying a laser beam along the dividing line 21, thereby performing the alignment of a laser beam application position. The alignment of the laser beam application position is also similarly carried out on dividing lines 21 that are formed on the optical device wafer 2 and extend in a direction perpendicular to the above predetermined direction. At this moment, although the front surface 20a, on which the dividing line 21 is formed, of the optical device wafer 2 faces down, as the image pick-up means 53 comprises infrared illuminating means, an optical system for capturing infrared radiation and an image pick-up device (infrared CCD) for outputting an electric signal corresponding to the infrared radiation as described above, an image of the dividing line 21 can be picked up through the back surface 20b.

Figure 7:
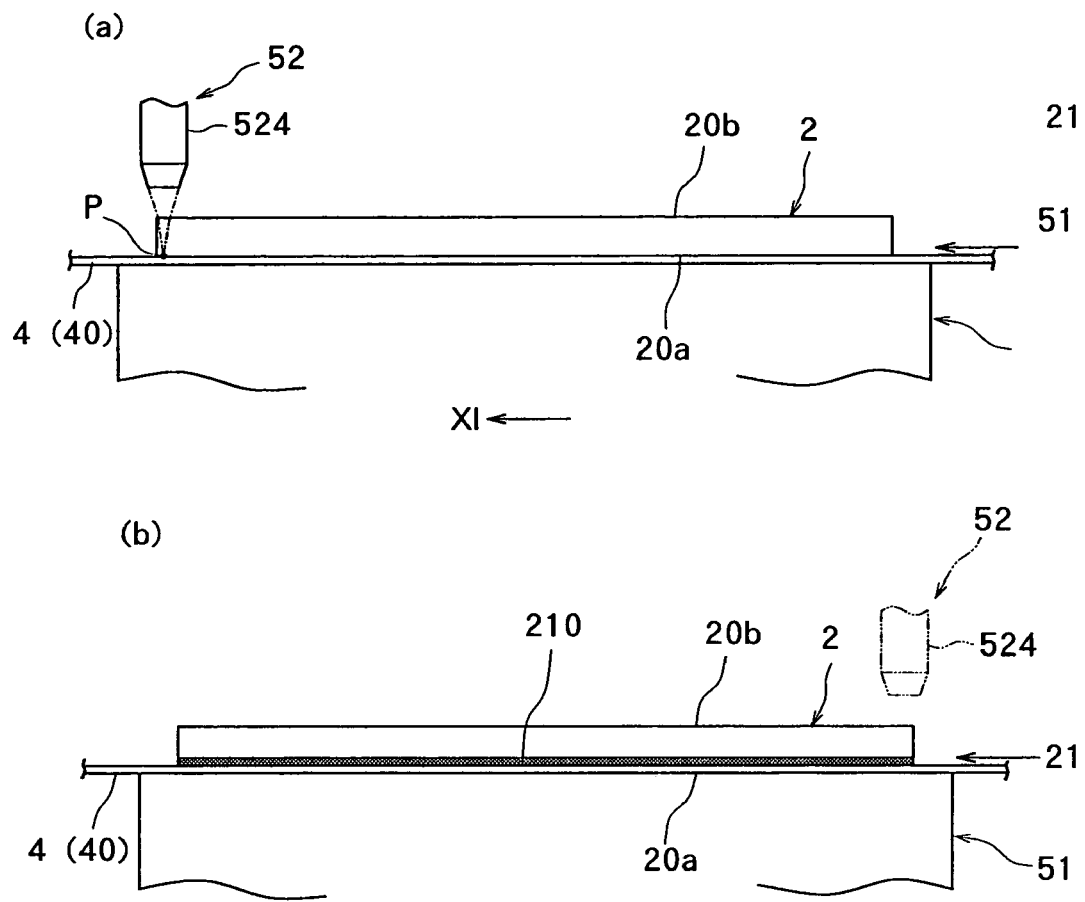
FIGS. 7(a) and 7(b) are diagrams for explaining the laser beam application step in the wafer laser processing method of the present invention.

After the dividing line 21 formed on the optical device wafer 2 held on the chuck table 51 is detected and the alignment of the laser beam application position is carried out as described above, the chuck table 51 is moved to a laser beam application area where the condenser 524 of the laser beam application means 52 for applying a laser beam is located as shown in FIG. 7(a) to bring one end (left end in FIG. 7(a)) of the predetermined dividing line 21 to a position right below the condenser 524 of the laser beam application means 52. The chuck table 51, that is, the optical device wafer 2 is moved in the direction indicated by the arrow X1 in FIG. 7(a) at a predetermined feed rate while a pulse laser beam capable of passing through the sapphire substrate 20 of the optical device wafer 2 is applied from the condenser 524. When the irradiation position of the condenser 524 of the laser beam application means 52 reaches the other end of the dividing line 21 as shown in FIG. 7(b), the application of the pulse laser beam is suspended and the movement of the chuck table 51, that is, the optical device wafer 2 is stopped. In this laser beam application step, by setting the focusing point P of the pulse laser beam to a position near the front surface 20a (undersurface) which is one surface of the optical device wafer 2, a deteriorated layer 210 which is exposed to the front surface 20a (undersurface) is formed inward from the front surface 2a. This deteriorated layer 210 is formed as a molten re-solidified layer in which the wafer has been once molten and then re-solidified.

The processing conditions of the above laser beam application step are set as follows, for example.
Light source: YVO4 laser
Wavelength: pulse laser having a wavelength of 1,064 nm
Peak power density: $5.0 \times 10E8$ W/cm$^2$ to $2.0 \times 10E12$ W/cm$^2$
Focusing spot diameter: 1 μm
Repetition frequency: 40 to 400 kHz
Processing feed rate: 40 to 400 mm/sec When the pulse laser beam is applied with the focusing point P of the pulse laser beam set to a position near the front surface 20a (undersurface) of the optical device wafer 2 in the laser beam application step as described above, as the protective tape 4 (40) affixed to the front surface 20a (undersurface) of the optical device wafer 2 also absorbs the energy of the laser beam, air and water contained in the protective tape thermally expand by heating to produce bubbles. Since the protective tape 4 (40) is a tape having gas permeability as described above, the bubbles produced by heating pass through the protective tape 4 (40) and the holding portion that is made of a porous ceramic and constitutes the chuck table 51, and is absorbed by the suction means that is not shown. Consequently, the above bubbles do not accumulate in the space between the protective tape 4 (40) and the front surface 20a (undersurface) of the optical device wafer 2. As a result, the wafer held on the chuck table is not raised by the bubbles, thereby making it possible to prevent the displacement of the focusing point of the laser beam caused by the rise of the wafer by the bubbles and to eliminate a problem that the wafer holding force of the chuck table is declined.

Figure 8:
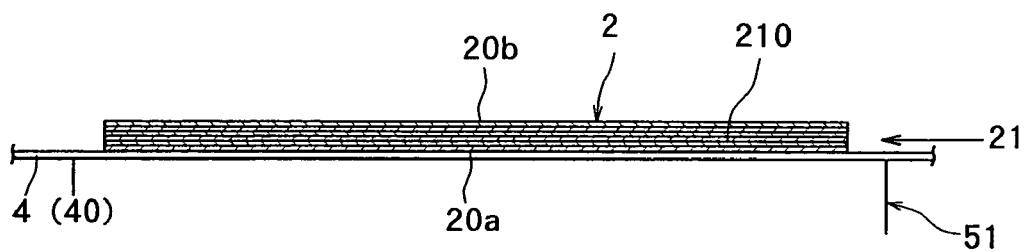
FIG. 8 is a diagram showing a state where deteriorated layers are formed in a laminate form in the inside of the wafer in the laser beam application step shown in FIGS. 7(a) and 7(b).

When the optical device wafer 2 is thick, as shown in FIG. 8, the above-described laser beam application step is carried out several times by changing the focusing point P stepwise so as to form a plurality of deteriorated layers 210.

After the laser beam application step is carried out along the predetermined dividing line 21 of the optical device wafer 2 as described above, the chuck table 51, that is, the optical device wafer 2 held on the chuck table 51 is indexing-moved a distance corresponding to the interval between the dividing lines 21 in the direction indicated by the arrow Y (indexing step) to carry out the above laser beam application step. After the above laser beam application step and the indexing step are carried out on all the dividing lines 21 extending in the predetermined direction of the optical device wafer 2, the chuck table 51, therefore, the optical device wafer 2 held on the chuck table 51 is turned at 90° to carry out the above laser beam application step and indexing step along dividing lines 21 extending in a direction perpendicular to the above predetermined direction, thereby making it possible to form deteriorated layers 210 along all the dividing lines 21 formed on the optical device wafer 2. After the deteriorated layers 210 are thus formed along all the dividing lines 21 formed on the optical device wafer 2, the routine proceeds to the dividing step where external force is applied to the optical device wafer 2 along the dividing lines 21 where the deteriorated layers 210 have been formed to divide it into individual optical devices 22.

While the present invention has been described based on the illustrated embodiment, the present invention is not limited to the embodiment, and various modifications may be made in the present invention without departing from the spirit and scope thereof. For example, in the illustrated embodiment, the protective tape 4 (40) is affixed to the front surface 20a of the optical device wafer 2 and a laser beam is applied from the back surface 20b of the optical device wafer 2. The protective tape 4 (40) may be affixed to the back surface 20b of the optical device wafer 2 and a laser beam may be applied to the front surface 20a of the optical device wafer 2. The present invention is effective also in the laser processing of a wafer comprising a lithium tantalate substrate, silicon carbide substrate, quartz substrate or silicon substrate, besides the optical device wafer comprising a sapphire substrate.

What is claimed is:

1. A wafer laser processing method for forming a deteriorated layer, which has been once molten and then re-solidified, in the inside of a wafer by applying a pulse laser beam capable of passing through the wafer, to the wafer along a dividing line formed on the wafer, comprising:

a protective tape affixing step for affixing a protective tape having gas permeability to one side of the wafer;

a wafer holding step for holding the wafer having the protective tape affixed thereto on a chuck table of a laser beam machine in such a manner that the one side of the wafer onto which the protective tape has been affixed comes into contact with the chuck table; and a laser beam application step for applying a pulse laser beam capable of passing through the wafer from the other side of the wafer held on the chuck table with its focusing point within the wafer at a position near the one side of the wafer to form the deteriorated layer exposed to the one side of the wafer along the dividing line in the inside of the wafer.

2. The wafer laser processing method according to claim 1, wherein the protective tape having gas permeability is a mesh-like tape.

3. The wafer laser processing method according to claim 1, wherein the protective tape having gas permeability is a porous tape.

* * * * *